United States Patent
Jeng

(10) Patent No.: US 6,474,257 B2
(45) Date of Patent: Nov. 5, 2002

(54) HIGH DENSITY PLASMA CHEMICAL VAPOR DEPOSITION CHAMBER

(75) Inventor: Pei-Ren Jeng, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/805,880

(22) Filed: Mar. 15, 2001

(65) Prior Publication Data

US 2002/0112666 A1 Aug. 22, 2002

(30) Foreign Application Priority Data

Feb. 20, 2001 (TW) ........................................ 90103848 A

(51) Int. Cl.[7] .......................... C23C 16/00; H05H 1/00
(52) U.S. Cl. ................. 118/723 I; 118/723 E; 156/345.48; 156/345.34
(58) Field of Search .................... 118/723 I, 723 E, 118/723 MW, 723 AN; 156/345.48, 345.34, 345.33, 345.47

(56) References Cited

U.S. PATENT DOCUMENTS

| | | | | |
|---|---|---|---|---|
| 5,439,524 A | * | 8/1995 | Cain et al. | 1118/723 E |
| 5,795,429 A | * | 8/1998 | Ishii et al. | 156/345 |
| 6,006,694 A | * | 12/1999 | DeOrnellas et al. | 118/723 I |
| 6,089,183 A | * | 7/2000 | Imai et al. | 118/723 E |
| 6,132,552 A | * | 10/2000 | Donohoe et al. | 156/345 |
| 6,162,323 A | * | 12/2000 | Koshimizu | 156/345 |
| 6,263,829 B1 | * | 7/2001 | Schneider et al. | 118/723 I |

FOREIGN PATENT DOCUMENTS

JP    9-223672 A    *  8/1997    ......... H01L/21/205

* cited by examiner

*Primary Examiner*—Gregory Mills
*Assistant Examiner*—P. Hassanzadeh

(57) ABSTRACT

The present invention provides a high density plasma (HDP) chemical vapor deposition (CVD) chamber. The upper wall of the HDP CVD chamber in the present invention is composed by two ceramic layers with a defaulted distance, so the number and the distribution of the nozzles on the inner layer of the upper wall of the chamber can be adjusted according to desire. In another hand, the material of the upper wall of the chamber in the present invention is ceramic so that can be penetrated by the electromagnetic field created by the inductive coil entwined outside the chamber to generate a region of plasma within the chamber. By the application of the present invention, the time and the costs of installing the nozzles can be saved and the problem of adjusting the nozzles is not need to consider.

16 Claims, 2 Drawing Sheets

HIGH DENSITY PLASMA CHEMICAL VAPOR DEPOSITION CHAMBER

FIELD OF THE INVENTION

The present invention relates to a high density plasma (HDP) chemical vapor deposition (CVD) chamber. Particularly, the present invention relates to a high density plasma chemical vapor deposition chamber with an upper wall composed by two ceramic layers having a defaulted distance between them.

BACKGROUND OF THE INVENTION

A high density plasma (HDP) chemical vapor deposition (CVD) chamber is an apparatus for a CVD process to a wafer at a lower temperature.

Referring to FIG. 1, it shows a cross sectional view of a conventional HDP CVD chamber 10. While current flows through the inductive coil 14 deposed outside the upper wall 12 of the chamber 10, the inductive coil 14 creates inductance and an electric field is induced. The electric field induces an inductive current through mediums (such as air) and emits energy in the form of plasma within the chamber 10 ultimately so that a region of plasma is generated. The processing gas 22 is introduced into the chamber 10 through a plurality of nozzles 16 in the edge of the chamber 10, so that the uniformity to the thickness of the deposited film is directly influenced by the number and the direction of the nozzles 16, and results the problem of pattern reproduce in the specificity of the wafer thickness. Due to the processing gas 22 is introduced into the chamber 10 through a plurality of nozzles 16 in the edge of the chamber 10, so the thickness deposited on the edge of the wafer 18 is greater than the center of the wafer 18 upon the susceptor 20 and leads the thickness of the center of the wafer 18 to be thinner.

Referring to FIG. 2, it shows a cross sectional view of a conventional HDP CVD chamber 30. The upper wall 32 of the chamber 30 is in the shape of rectangle and a single nozzle 44 is installed in the middle of it. The region of plasma within the chamber 30 is formed by current flowing through the inductive coil 34. The processing gas 42 can be introduced into the chamber 30 through the around nozzles 36 and be done through the nozzle 44 also. Referring to FIG. 4, it shows the thickness distribution of a deposited wafer 38 on the susceptor 40 by applying the HDP CVD chamber 30 shown in FIG.2. Shown in FIG. 4, the positions of the arrows are where the nozzles 36 are and each line, such as mark 100, in the drawing is a contour line, so it is discovered that the thickness of film deposited on the wafer 38 is not uniform. The fault to the thinner center thickness of the wafer 10 will be improved by using the deposited wafer 38. However, the problem of pattern reproduce from nozzles also exists.

For the foregoing reasons, there is a need for a different design of the flux of the processing gas within the chamber to enhance the thickness uniformity of the deposited film in the HDP CVD chamber and to avoid the problem of pattern reproduce from nozzles in order to provide the need of increasing the wafer size or decreasing the size of the semiconductor component in future.

SUMMARY OF THE INVENTION

According to the background of the invention, the processing gas of the conventional HDP CVD chamber is introduced into the chamber through the nozzles in the compass, so that results in a lack of uniformity to the deposited film thickness and the problem of the pattern reproduce in the specificity of the wafer thickness exists. As a result, the present invention is directed to a design to the flux of the processing gas within the chamber that satisfies the foregoing needs to improved the disadvantage of the prior art.

In one aspect of the invention, the present invention provides a HDP CVD chamber, and an upper wall of the chamber is composed by two layers having a defaulted distance between, wherein the distribution and the number of the nozzles on the inner layer of the upper wall can be adjusted according to desire. The number of the nozzles is greater than the slender nozzles of the conventional chamber, so the uniformity to the distribution of the gases within the chamber can be enhanced.

In another aspect of the invention, the present invention provides a HDP CVD chamber, and the upper wall of the chamber includes an outer layer and an inner layer. Between the outer layer and the inner layer, there is a defaulted distance to form a channel. The outer layer is a smooth-faced structure and a plurality of nozzles is distributed in the form of concentric circles on the inner layer. As a result of the number of the nozzles of the present invention is greater than the prior art, the distribution to the airflow of the processing gas is more average within the chamber so that the thickness of the deposited film is more uniform in order to consist with the need of the increasing wafer size or the decreasing semiconductor device size.

For reasons discuss above, the present invention provides a HDP CVD chamber. The upper wall of the chamber in the present invention is composed of ceramic, and the upper wall of the chamber includes an outer layer and an inner layer. Between the outer layer and the inner layer, there is a defaulted distance to form a channel. The upper wall of the chamber composed of insulated ceramic that can be penetrated by the magnetic field created by the inductive coil entwined outside the outer layer to form a HDP within the chamber. Specially, the processing gas is introduced into the channel between the outer layer and inner layer, and then it flows into the chamber through the nozzles on the inner layer. As a result of the number of the nozzles of the present invention is greater than the prior art and the nozzles on the inner layer are distributed uniformly in the form of concentric circles, so that the difficult problem in achieving the request for the uniformity to a greater size of deposited film and the problem of needing high performance device by the limited number of the nozzles with the increasing wafer size or the decreasing semiconductor device size can be solved, and can save the time and the costs of installing and adjusting the nozzles seriatim.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
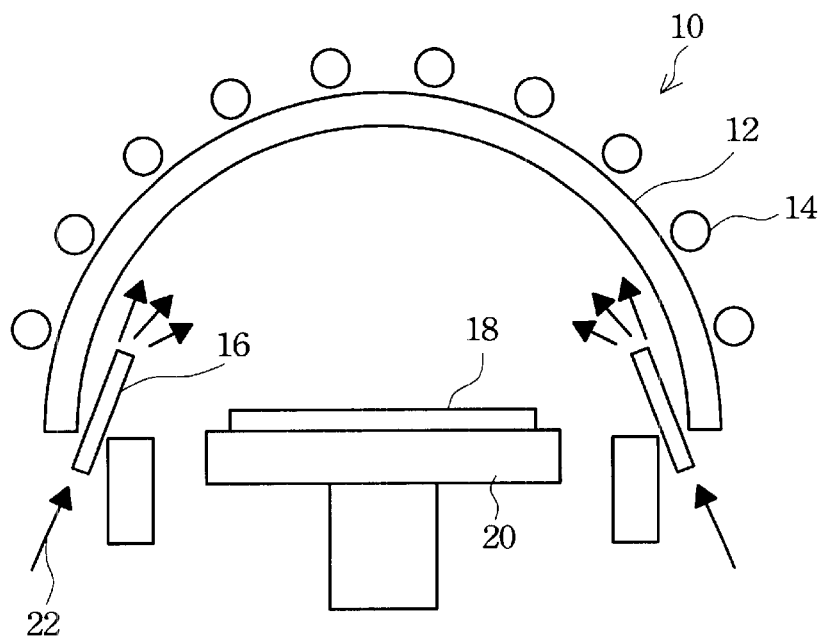
FIG. 1 is a cross-sectional view of a conventional HDP CVD chamber.
Figure 2:
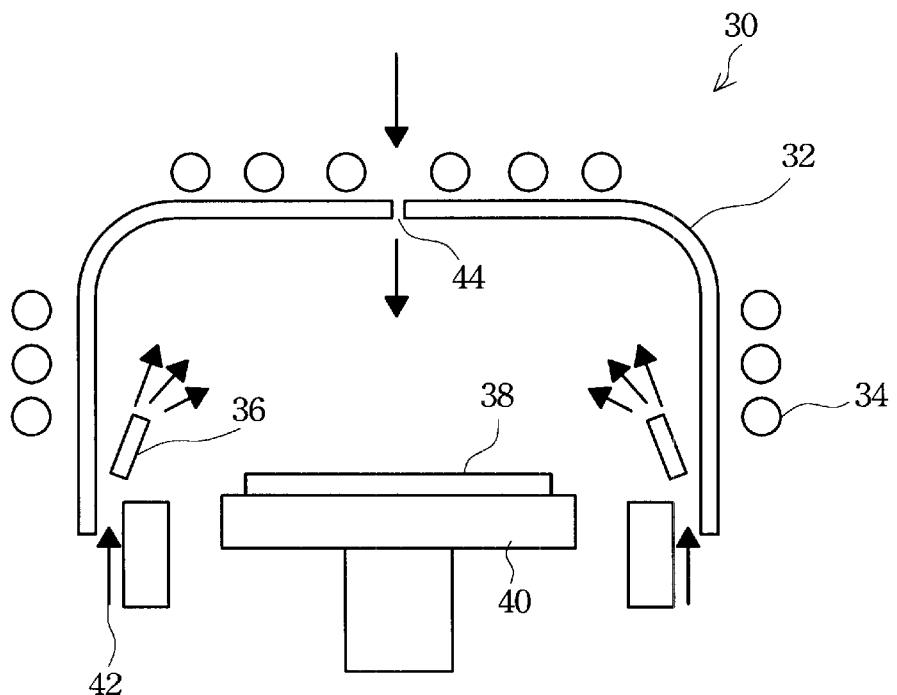
FIG. 2 is a cross-sectional view of a conventional HDP CVD chamber, wherein a single nozzle is installed on the upper wall of the chamber.
Figure 3:
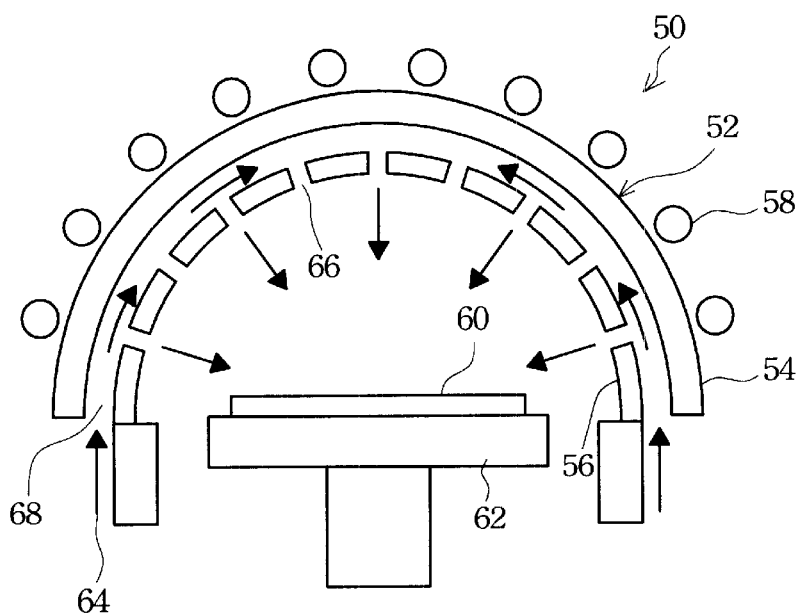
FIG. 3 is a cross-sectional view of a preferred embodiment of a HDP CVD chamber of the present invention.

Referring to FIG. 3, a cross-sectional view of a preferred embodiment of a HDP CVD chamber 50 of the present invention. The chamber 50 at least comprises an inductive coil 58, a susceptor 62, a plurality of nozzles 66, and an upper wall 52 composed of ceramic. The material of the upper wall 52 can be used another material and is not limited of the prior ceramic. From the inside to the outside, the upper wall 52 includes an inner layer 56 having a semispherical structure with the nozzles 66 on it and an outer layer 54 having a smooth-faced semispherical structure. The outer layer 54 and the inner layer 56 are concentric spheres and there is a predetermined distance to form a channel 68 between the two layers. The defaulted distance described herein is not referred to any particular distance as long as the processing gas 64 can flow through the channel 68.

Figure 4:
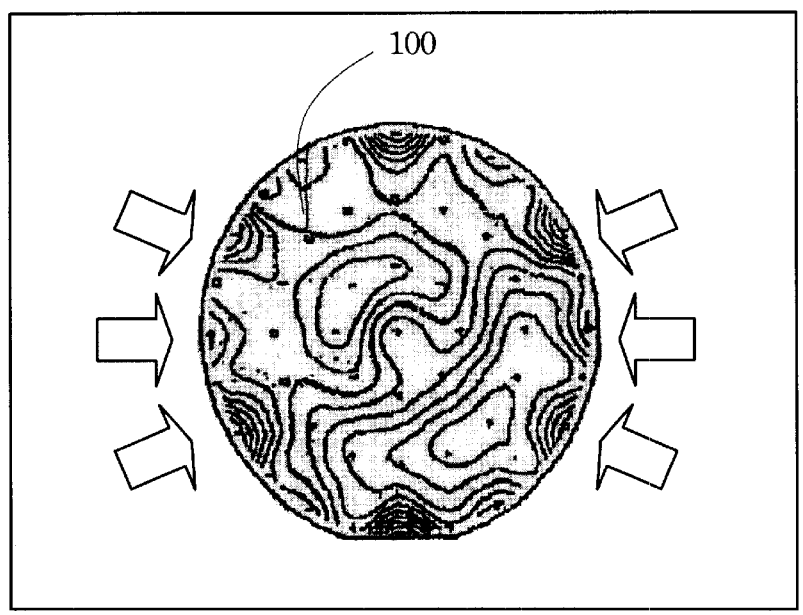
FIG. 4 is a schematic diagram of the distribution of the thickness to a wafer deposited with a HDP CVD chamber in the FIG. 2.

Additionally, the nozzles 66 connect the chamber 50 and the channel 68. The arrows shown in FIG. 4 represent the flow direction of the processing gas 64. While current flows through the inductive coil 58 outside the outer layer 54 of the upper wall 52, the inductive coil 58 will be induced to create inductance and induces a magnetic field. The upper wall 52 composed of ceramic is insulated that can be penetrated by the magnetic field created by the inductive coil 58 deposed outside the outer layer 54, and the magnetic field generates an induced current through medium (such as air) and ultimately emits energy in the form of plasma to generate a region of plasma within the chamber 50. While processing wafer 60 on the susceptor 62 with the HDP CVD by applying the chamber 50, the processing gas 64 flows into the channel 68 between the outer layer 54 and the inner layer 56 of the upper wall 52 and then flows into the chamber 50 through the nozzles 66 distributed in concentric circles on the inner layer 56 to participate in the process of a HDP CVD.

The advantage of the present invention is to provide a HDP CVD chamber wherein the upper wall of the chamber is composed by two ceramic layers with semispherical structure. The distribution of the nozzles on the inner layer of the upper wall of the chamber can be adjusted according to desire, and the number of the nozzles of the chamber is greater than the slender nozzles of the conventional chamber so the overall distribution of the gas within the chamber can be enhanced to increase the uniformity to the thickness of the deposited film. Accordingly, the designed apparatus of multiplicity nozzles between two layers of the semispherical ceramic can save the time and the costs for installing and adjusting the nozzles seriatim.

The foregoing is only a preferred embodiment of the present invention, so that the shape of the upper wall is not limited to the shape of semispherical, but there must be a predetermined distance between the two layers of the upper wall. In another hand, the composed material of the upper wall is not limited to the ceramic and can be selected from other insulating materials.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A high density plasma chemical vapor deposition chamber comprising:
   a susceptor adapted to depose a wafer;
   an upper wall comprising:
      an outer semispherical layer having a first semispherical structure; and
      an inner semispherical layer having a second semispherical structure;
      wherein the inner semispherical layer has a plurality of nozzles in different angles for directing a processing gas toward the wafer, and there is a predetermined distance between the outer semispherical layer and the inner semispherical layer to form a channel; and
   an inductive coil entwined outside the outer semispherical layer.

2. The chamber according to claim 1, wherein the material of the upper wall is an electrically insulating material.

3. The chamber according to claim 2, wherein the electrically insulating material is a ceramic material.

4. The chamber according to claim 1, wherein the outer semispherical layer and the inner semispherical layer are concentric spheres.

5. The chamber according to claim 1, wherein the nozzles are distributed in concentric circles.

6. The chamber according to claim 1, wherein the nozzles on the inner semispherical layer are distributed uniformly.

7. The chamber according to claim 1, wherein the channel is adapted to flow the processing gas.

8. The chamber according to claim 7, wherein the processing gas flows into the chamber through the nozzles.

9. A high density plasma chemical vapor deposition chamber comprising:
   a susceptor adapted to depose a wafer;
   an upper wall composed by an electrically insulating material, comprising:
      a curved outer layer; and
      a curved inner layer, the outer layer and the inner layer being formed concentrically;
      wherein the inner layer, has a plurality of nozzles in different angles for directing a processing gas toward the wafer, and there is a predetermined distance between the outer layer and the inner layer to form a channel; and
   an inductive coil entwined outside the outer layer.

10. The chamber according to claim 9, wherein the electrically insulating material is a ceramic material.

11. The chamber according to claim 9, wherein the outer layer and the inner layer are concentric spheres.

12. The chamber according to claim 9, wherein the nozzles are distributed in concentric circles.

13. The chamber according to claim 9, wherein the nozzles on the inner layer are distributed uniformly.

14. The chamber according to claim 9, wherein the channel is adapted to flow the processing gas.

15. The chamber according to claim 14, wherein the processing gas flows into the chamber through the nozzles.

16. A high density plasma chemical vapor deposition chamber comprising:
   a susceptor adapted to depose a wafer;
   an upper wall which is convexly semispherical and composed of an electrically insulating material, wherein the upper wall covers the susceptor, and comprises:
      an outer semispherical layer; and
      an inner semispherical layer, the outer semispherical layer and the inner semispherical layer being convexly semispherical and formed concentrically, the outer semispherical layer and the inner semispherical layer enclosing the wafer;

wherein the inner semispherical layer has a plurality of nozzles in different angles distributed uniformly in circles on the inner semispherical layer for directing a processing gas toward the wafer, and there is a predetermined distance between the outer semispherical layer and the inner semispherical layer to form a channel having at least one lower open ends through which a processing gas is first injected, and thereafter the processing gas flows into the chamber through the nozzles; and an inductive coil entwined outside the outer semispherical layer.

* * * * *